(12) United States Patent
Islam et al.

(10) Patent No.: US 12,720,904 B2
(45) Date of Patent: Aug. 25, 2026

(54) METHOD FOR MANUFACTURING DEEP-JUNCTION LOW-GAIN AVALANCHE DETECTORS AND ASSOCIATED SEMICONDUCTOR SUBSTRATES

(71) Applicant: CACTUS MATERIALS, INC., Tempe, AZ (US)

(72) Inventors: Rafiqul Islam, Gilbert, AZ (US); Sager Ayyoub, Glendale, AZ (US)

(73) Assignee: Cactus Materials, Inc., Tempe, AZ (US)

( * ) Notice: Subject to any disclaimer, the term of this patent is extended or adjusted under 35 U.S.C. 154(b) by 391 days.

(21) Appl. No.: 18/282,446

(22) PCT Filed: Mar. 18, 2022

(86) PCT No.: PCT/US2022/020902

§ 371 (c)(1),
(2) Date: Sep. 15, 2023

(87) PCT Pub. No.: WO2022/198017

PCT Pub. Date: Sep. 22, 2022

(65) Prior Publication Data

US 2024/0186432 A1 Jun. 6, 2024

Related U.S. Application Data

(60) Provisional application No. 63/162,686, filed on Mar. 18, 2021.

(51) Int. Cl.
*H10F 77/14* (2025.01)
*H10F 30/225* (2025.01)
(Continued)

(52) U.S. Cl.
CPC ........... *H10F 77/14* (2025.01); *H10F 30/225* (2025.01); *H10P 10/128* (2026.01); *H10P 10/14* (2026.01); *H10P 90/1914* (2026.01)

(58) Field of Classification Search
CPC ........ H10F 77/14; H10F 30/225; H10P 10/14; H10P 10/128; H10P 90/1914
See application file for complete search history.

(56) References Cited

U.S. PATENT DOCUMENTS 5,739,044 A 4/1998 Terasawa
9,728,667 B1 8/2017 Johnson et al.
(Continued)

FOREIGN PATENT DOCUMENTS

WO 2021087237 A1 5/2021

OTHER PUBLICATIONS

S. Ayyoub et al.: "A new approach to achieving high granularity for silicon diode detectors with impact ionization gain", arxiv.org, Jan. 2, 2021 (Jan. 2, 2021), pp. 1-16, https://arxiv.org/pdf/2101.00511 (Year: 2021).*

(Continued)

*Primary Examiner* — Dao H Nguyen
(74) *Attorney, Agent, or Firm* — LOZA & LOZA, LLP; David S. Sarisky

(57) ABSTRACT

A method of manufacturing a semiconductor substrate having a deep junction, forming at least one p+ region (n+ region) on a front side of a p-type (n-type) high-resistance wafer; and forming at least one n+ region (p+ region) on a front side of a n-type (p-type) high-resistance wafer. The method further includes aligning the at least one p+ region (n+ region) on a front side of a p-type (n-type) high-resistance wafer with the at least one n+ region (p+ region) on a front side of a n-type (p-type) high-resistance wafer; and bonding the front sides of the high-resistance wafers to form a wafer assembly having at least one deep p-n junction at a depth of at least 1 micron from the backside of the n-type (p-type) high-resistance wafer.

15 Claims, 12 Drawing Sheets

(51) Int. Cl.
*H10P 10/00* (2026.01)
*H10P 90/00* (2026.01)

(56) References Cited

U.S. PATENT DOCUMENTS

| | | | | |
|---|---|---|---|---|
| 11,923,471 | B2 * | 3/2024 | Gee | H10F 39/103 |
| 2001/0054747 | A1 * | 12/2001 | Schligtenhorst | H10D 8/045<br>257/591 |
| 2008/0085477 | A1 | 4/2008 | Verhaverbeke et al. | |
| 2009/0315135 | A1 * | 12/2009 | Finkelstein | H10F 77/959<br>257/E31.113 |
| 2010/0245809 | A1 | 9/2010 | Andreou et al. | |
| 2012/0205731 | A1 | 8/2012 | Henderson et al. | |
| 2012/0261729 | A1 | 10/2012 | Finkelstein et al. | |
| 2014/0203386 | A1 * | 7/2014 | Bui | H10F 30/2955<br>257/431 |
| 2014/0273374 | A1 | 9/2014 | Yedinak et al. | |
| 2019/0019899 | A1 | 1/2019 | Wang et al. | |
| 2019/0157257 | A1 | 5/2019 | Mallikarjunaswamy | |
| 2023/0065356 | A1 * | 3/2023 | Giacomini | H10D 8/024 |

OTHER PUBLICATIONS

Ayyoub et al.; “A new approach to achieving high granularity for silicon diode detectors with impact ionization gain”; Jan. 2, 2021; https://arxiv.org/pdf/2101.00511.pdf; Retrieved on May 25, 2022; 16 pgs.

International Search Report and Written Opinion, International Patent Application No. PCT/US2022/020902, Jun. 29, 2022, 13 pgs.

* cited by examiner

METHOD FOR MANUFACTURING DEEP-JUNCTION LOW-GAIN AVALANCHE DETECTORS AND ASSOCIATED SEMICONDUCTOR SUBSTRATES

CROSS-REFERENCE TO RELATED APPLICATION(S)

This application is a National Stage of International Application No. PCT/US2022/020902, filed Mar. 18, 2022, which claims the benefit of U.S. Provisional Application Ser. No. 63/162,686, entitled "Manufacturing of Deep Junction Semiconductor Sensors", and filed on Mar. 18, 2021, the entire disclosures of which are expressly incorporated by reference herein in its entirety.

STATEMENT REGARDING FEDERALLY SPONSORED RESEARCH

This invention was made with Government support under contract DE-SC0020572 awarded by the U.S. Department of Energy. The U.S. Government has certain rights to this invention.

TECHNICAL FIELD

The present disclosure relates generally to the manufacturing of semiconductor devices, and more particularly, to methods of manufacturing deep-junction low-gain avalanche detectors and associated semiconductor substrates.

BACKGROUND

The past five years has seen the development of low-to-moderate gain (x10-50) silicon avalanche diodes (LGADs), motivated by a desire to achieve a time-stamp resolution of +/−30 ps for tracks arising from proton-proton collisions at the LHC. The critical enabling development is the ability to create a region in the sensor for which the field is high enough to induce impact ionization by electrons, but still low enough that the holes do not multiply. This leads in turn to a limited, tightly controlled avalanche that avoids the crosstalk and recovery-time limitations experienced by silicon photomultipliers and avalanche photodiodes. Progress in the development of LGADs has allowed them to become a baseline option for both the CMS and ATLAS detectors for the high-luminosity (HL-LHC) upgrade of the LHC.

For conventional LGADs of the type being developed for HL-LHC applications, the high-field ("gain") layer is created just below the cathode readout layer and extends between the segmented implants that provide the ohmic connection to the readout electrodes. This high field leads to breakdown between the implants, requiring the use of an additional structure, known as the Junction Termination Extension (JTE), to isolate the implants from one another. This in turn leads to an area of suppressed gain in the region between the two implants that is of order 100 μm, limiting the granularity of conventional LGADs to $1\times1$ $mm^2$ or so. While this is adequate for the time-stamping application envisioned for the HL-LHC upgrade, the widespread application to a wide range of other scientific pursuits, such as full four-dimensional (4D) tracking and next-generation X-ray imaging, require granularity scales of order $50\times50$ $\mu m^2$. In fact, with the possible exception of radiation hardening, the reduction of the achievable LGAD granularity scale is the most promising avenue on this relatively new type of solid-state sensor.

Thus, there is a need to overcome the current granularity limits of LGAD sensors. These limitations may be addressed by deep-junction LGAD (DJ-LGAD) sensors, structured as disclosed in International Patent Publication No. WO 2021/087237. Such sensors, however, require semiconductor substrates with deep junctions. It is therefore desirable to provide methods of manufacturing semiconductor substrates with deep junctions.

SUMMARY

In one aspect of the disclosure, a method of manufacturing a semiconductor substrate having a deep junction, forming at least one p+ region (n+ region) on a front side of a p-type (n-type) high-resistance wafer; and forming at least one n+ region (p+ region) on a front side of a n-type (p-type) high-resistance wafer. The method further includes aligning the at least one p+ region (n+ region) on a front side of a p-type (n-type) high-resistance wafer with the at least one n+ region (p+ region) on a front side of a n-type (p-type) high-resistance wafer; and bonding the front sides of the high-resistance wafers to form a wafer assembly having at least one deep p-n junction at a depth of at least 1 micron from the backside of the n-type (p-type) high-resistance wafer.

In another aspect of the disclosure, a method of manufacturing a semiconductor substrate having a deep junction includes forming at least one p+ region (n+ region) within a p-type (n-type) structure at a depth from a front side of the p-type (n-type) structure in the range 0 to 2 microns; and forming at least one n+ region (p+ region) within the p-type (n-type) structure above the least one p+ region (n+ region). The p+ region and n+ region may be formed using high ion implantation techniques. The method further includes applying a p-type (n-type) layer having a thickness in the range of 1-10 microns on the front side of the p-type (n-type) structure, to thereby form a semiconductor substrate having at least one deep p-n junction at a depth of at least 1 micron from the front side of the p-type (n-type) structure. The p-type (n-type) layer may be applied using epitaxial techniques or it may be separately formed and bonded to the front side of the p-type (n-type) structure.

In another aspect, a method of manufacturing a sensor includes obtaining a semiconductor substrate having a deep junction. The semiconductor substrate may be manufactured using one of the above disclosed method. The method further includes forming a top layer construction on the semiconductor substrate. The top layer construction has one or more electrodes above the deep junction.

It is understood that other aspects of apparatuses and methods will become readily apparent to those skilled in the art from the following detailed description, wherein various aspects of apparatuses and methods are shown and described by way of illustration. As will be realized, these aspects may be implemented in other and different forms and its several details are capable of modification in various other respects. Accordingly, the drawings and detailed description are to be regarded as illustrative in nature and not as restrictive.

BRIEF DESCRIPTION OF THE DRAWINGS

Various aspects of apparatuses and methods will now be presented in the detailed description by way of example, and not by way of limitation, with reference to the accompanying drawings, wherein.

DETAILED DESCRIPTION

Sensors play a key role in detecting both broad ranges of charged particles and photons. The signals from an individual sensor that can be used include ionization deposited, phonons created, or light emitted from excitations of the material. The individual sensors are then typically arrayed for detection of individual particles or groups of particles. The current generation mechanism of the semiconductor sensor is the same as that of normal photodiode. When energy (light, charge, x-rays, and others) enters to photodiode, electron hole pairs (e-h) are generated when energy is higher than the bandgap energy of the photodiode.

Figure 1:
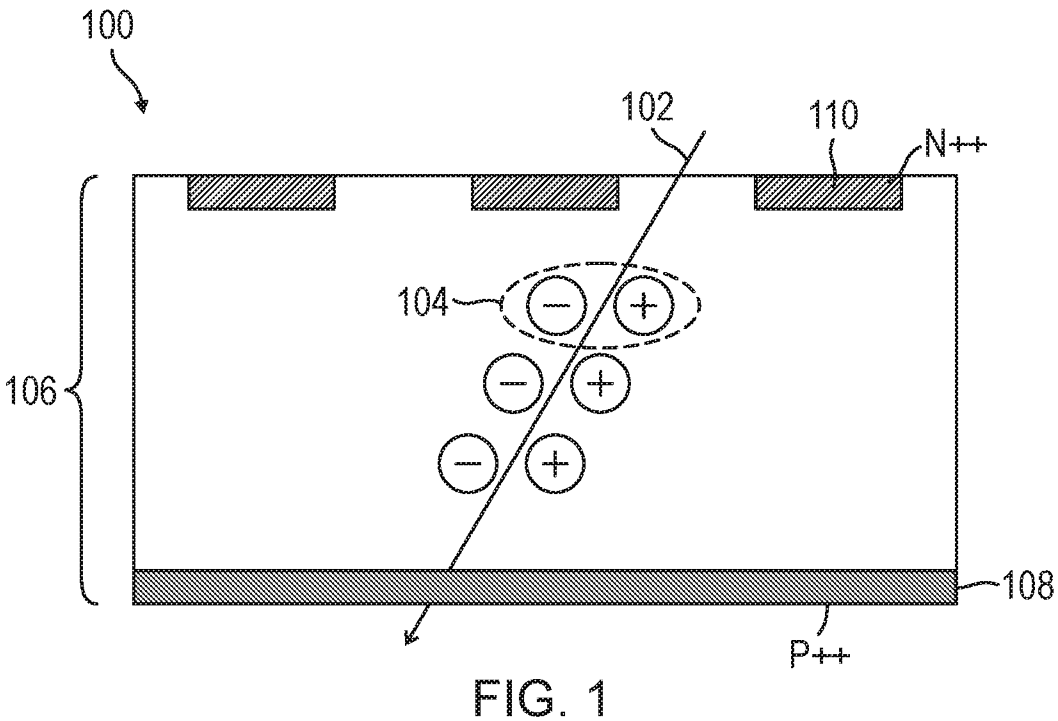
FIG. 1 is an illustration of a standard semiconductor detector.

The basic operational principles of a conventional n-on-p silicon detector 100 are shown in FIG. 1. An external bias voltage (not shown) polarizes the p-n junction inversely, creating a large, depleted volume. When an incident radiation 102 of a charged particle or photons crosses the detector 100, it creates electron-hole (e-h) pairs 104 along its path. The number of e-h pairs 104 created depends on the particle type (for example α-particles create many more pairs than minimum ionizing particles), the energy, and the detector 100 thickness. Here the body 106 of the detector 100 includes a continuous p++ back side electrode 108 and a segmented n++ top electrode 110 that provides position resolution. When radiation 102 interacts with the detector 100, e-h pairs 102 are generated.

The current generation mechanism of the avalanche photo detector (APD) is the same as that of normal photodiode. But the APD is different from a photodiode in that the ADP has functionality to multiply the generated e-h carriers. When e-h pairs are generated in the depletion layer of an APD with a reverse voltage applied to the p-n junction, the electric field is created across the p-n junction. When electric field reaches a certain level, the e-h carriers are likely to collide with lattice of the crystal. This further increases the electrical field, and causes "ionization," referred to as "impact ionization." Impact ionization generates a phenomenon known as avalanche multiplication. It also can be termed as "gain" of the energy due to the avalanche multiplication.

Figure 2:
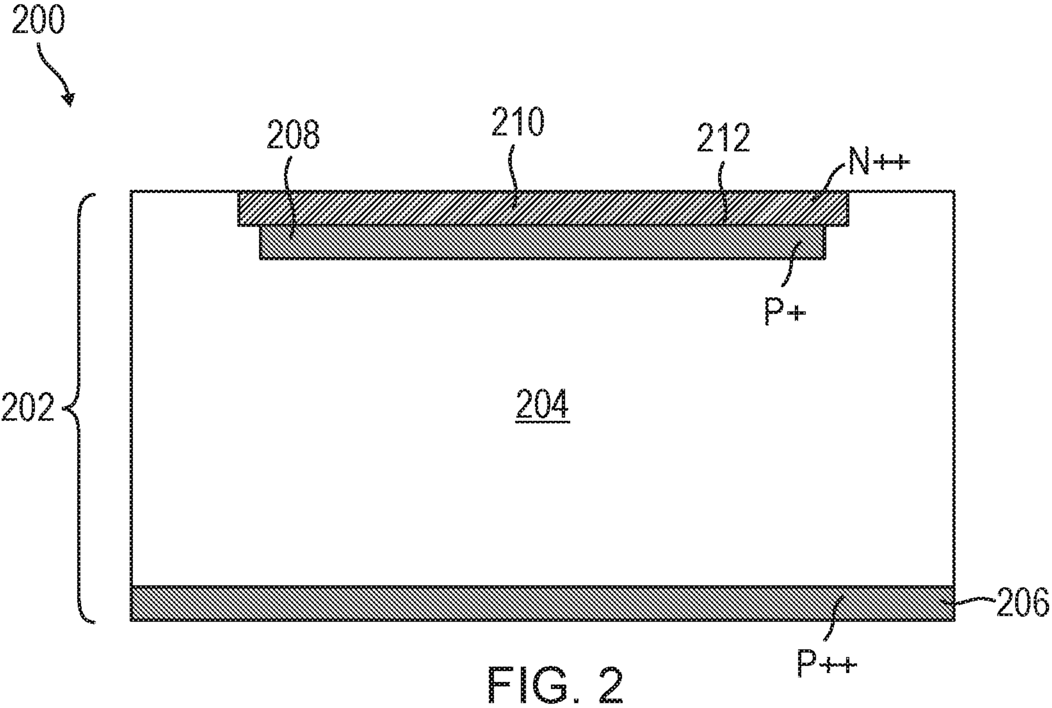
FIG. 2 is an illustration of a standard avalanche detector.

An example APD structure 200 is shown in FIG. 2. In this example, the body 202 of the detector 200 includes a p-type substrate 204, a continuous p++ back side electrode 206, a p+ gain layer 208, a continuous n++ electrode 210, and an n-p junction 212. Here the doping of p+ gain layer 208 and the n++ electrode 210 determines the gain of the detector 200 according to known principles of radiation detector design. The doping types can also be interchanged in the detector of FIG. 2. In cases of such an interchange, there is a continuous p++ electrode instead of an n++ electrode, an n-type substrate instead of a p-type substrate, and n+ gain layer instead of a p+ gain layer, and a continuous p++ electrode instead of a continuous n++ electrode.

When the detector 200 of FIG. 2 is configured to provide low gain (typically ranges from 5 to 100 times), it is termed a low-gain avalanche detector (LGAD). Compared to standard APDs, LGADs enable fine segmentation pitches in the fabrication of detectors free from the limitations commonly found in conventional APD structures. The LGAD also provides low noise compared to a conventional APD. The gain of a LGAD is more stable relative to a standard APD. For example, in semiconductors, an APD has a gain of 100, while a LGAD the gain is typically in below 100.

Semiconductor Substrate with Deep Junction

In accordance with embodiments disclosed herein a semiconductor substrate is manufactured to position p-n junctions deep inside materials of the substrate, e.g., a silicon wafer. Deep junction means any junction formed (intentionally or/and unintentionally) deep inside the wafer or other related materials. Example depth positions of an n-p junction obtained with the manufacturing techniques disclosed herein are in the range of 1-10 μm from a surface of the substrate.

In one example embodiment, a deep-junction semiconductor substrate is manufactured as follows: a p-type (n-type) high-resistance wafer is stripped of a resist layer on both sides, then a patterned photoresist mask is applied to the front side. "High-resistance" refers to resistances above 500 ohm-cm. In some embodiments, "high-resistance" may be in the range of 500-1000 ohm-cm and even above 1000 ohm-cm. The front side is then p-doped (n-doped) using ion implantation, then the photoresist layer is stripped, and the wafer is cleaned. A patterned photoresist mask is applied to the front side of an n-type (p-type) high-resistance wafer. The front side is then n-doped (p-doped) using ion implantation and the photoresist layer is stripped. The p-type and n-type wafers are aligned and bonded using pressure then annealing, thus creating deep-junction semiconductor substrate have deep n-p junctions.

Before describing different techniques for manufacturing a semiconductor substrate with deep n-p junctions in more detail, a general description of a low-gain avalanche detector that may be manufacture using the deep-junction semiconductor substrate is provided.

Deep-Junction Low-Gain Avalanche Photodetector (DJ-LGAD)

The innovation behind the DJ-LGAD is the burying of a planar p-n junction several microns below the surface of the device, combined with the fact that, with a carefully tuned doping profile, this p-n junction can serve the dual purpose of providing the limited-avalanche gain region characteristic of LGADs. FIG. 1 provides a schematic of the DJ-LGAD doping geometry. Additionally, with further judicious choice of the doping profile, the fields outside of this thin, buried gain-layer/junction can be made small enough so that conventional segmentation techniques (N++ implants isolated from each other with a ~1 μm p-stop) can be made use of at the cathode readout surface, while still being large enough so that the carrier drift velocities remain saturated throughout the bulk of the device. As a result, the DJ-LGAD will achieve both the superior temporal resolution and frame rate exhibited by conventional LGADs, while allowing for a much-reduced granularity scale.

Figure 3A:
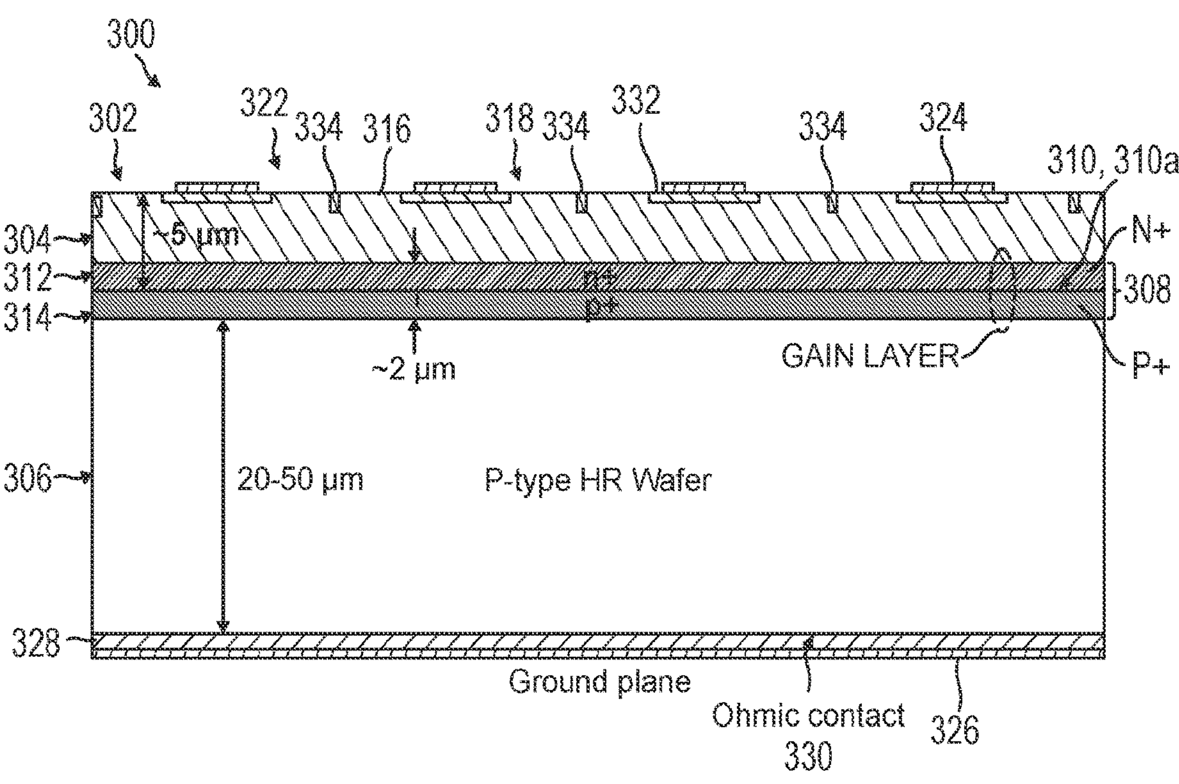
FIG. 3A is a schematic illustration of the doping geometry of a deep-junction low-gain avalanche detector (DJ-LGAD) formed in part from manufactured from a deep-junction semiconductor substrate manufactured in accordance with disclosed embodiments.

FIG. 3A is a schematic of the doping geometry of a DJ-LGAD manufactured from the presently disclosed deep-junction semiconductor substrate, showing the buried p-n junction of a gain layer and conventional segmentation strategy. The complementary surface charge densities of the n+ and p+ gain-layer structures lead to fields that largely cancel outside the gain layer, allowing for conventional segmentation at the readout surface.

With continued reference to FIG. 3A, a DJ-LGAD manufactured from the presently disclosed deep-junction semiconductor substrate includes a diode (p-n) junction buried a few micrometers below and away from the upper surface of the LGAD (the upper surface comprising the surface where segmentation is imposed). In the example shown, such positioning of the high electric-field gain region avoids the need for the JTE. More specifically, FIG. 3A illustrates an example avalanche diode 300 including a semiconductor structure 302 including an n-type region 304; a p-type region 306; and a gain region 308 buried between the n-type region 304 and the p-type region 306.

The gain region includes an n+-type region 312 having a higher n-type dopant density than the n-type region; a p+-type region 314 having a higher p-type dopant density than the p-type region; and a p-n junction 310 including an interface 310*a* between the n+-type region and the p+-type region. The n-type region 304 includes a plurality of segments 318, each of the segments including a first surface 316 of the n-type region 304 and the semiconductor structure.

FIG. 3A further illustrates the avalanche diode as including a readout structure 322 comprising a plurality of first electrodes 324, wherein at least one of the first electrodes is on each of the segments 318 and the first electrodes on different segments are electrically isolated from one another. A second electrode 326 is deposited on a second surface 328 of the semiconductor structure/p-type region and an ohmic contact 330 is formed between the p-type region 306 and the second electrode. The p-n junction 310 is reverse biased by application of an electric field between the first electrodes 324 in the readout structure and the second electrode 326. As illustrated in FIG. 3A, each of the segments 318 include implanted regions 332 having a higher dopant density than the n-type region 304. The implanted regions 332 form an ohmic contact with the first electrodes 324.

Also shown in FIG. 3A are electrostatic isolation barriers 334 (e.g., p-type wells) electrically isolating the segments 318. FIG. 3A illustrates the LGAD 300 as comprising a gain layer 308 including both the n+ region 312 and the p+ region 314, rather than just a p+ region. In other words, the gain layer 308 comprises the full p-n junction 310, rather than just the p+ doped area. A key benefit of burying the entire p-n junction 310, rather than just the highly doped p+ region 314, is that application of a reverse bias (creating a depletion zone) establishes an electric field in the region of the junction 310 that is similar to that of a parallel-plate capacitor. Specifically, application of the reverse bias voltage creates two planes comprising near equal (but opposite sign) high charge density, so that the electric field in the region of the junction 310 is sufficiently high to induce the limited and controlled impact ionization that is characteristic of LGADs. The electric fields are much lower outside the highly doped junction region, however, thereby avoiding the need to provide isolation between the readout segments 318 and the junction 310.

In comparing the example DJ-LGAD of FIG. 3A with the standard avalanche detector of FIG. 2, it is noted that in the DJ-LGAD of FIG. 3A the n-p junction 310 is located several microns deep into p-type substrate 306, while the n-p junction 212 in the detector of FIG. 2 is adjacent the top of the p-type substrate 204 just beneath the n++ layer 210. Several microns can be from 2 microns to 10 microns or even more. FIG. 3A, for example, shows the deep junction layer approximately 2-5 microns deep from the top of the wafer.

Figure 3B:
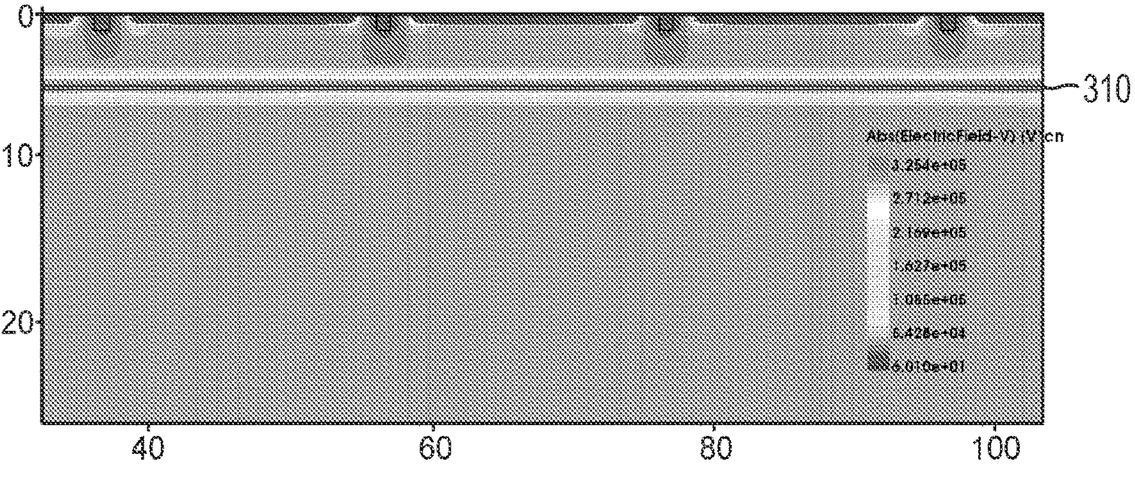
FIG. 3B is a technology computer-aided design simulation of electrical field mapping of the DJ-LGAD of FIG. 3A.
Figure 4A:
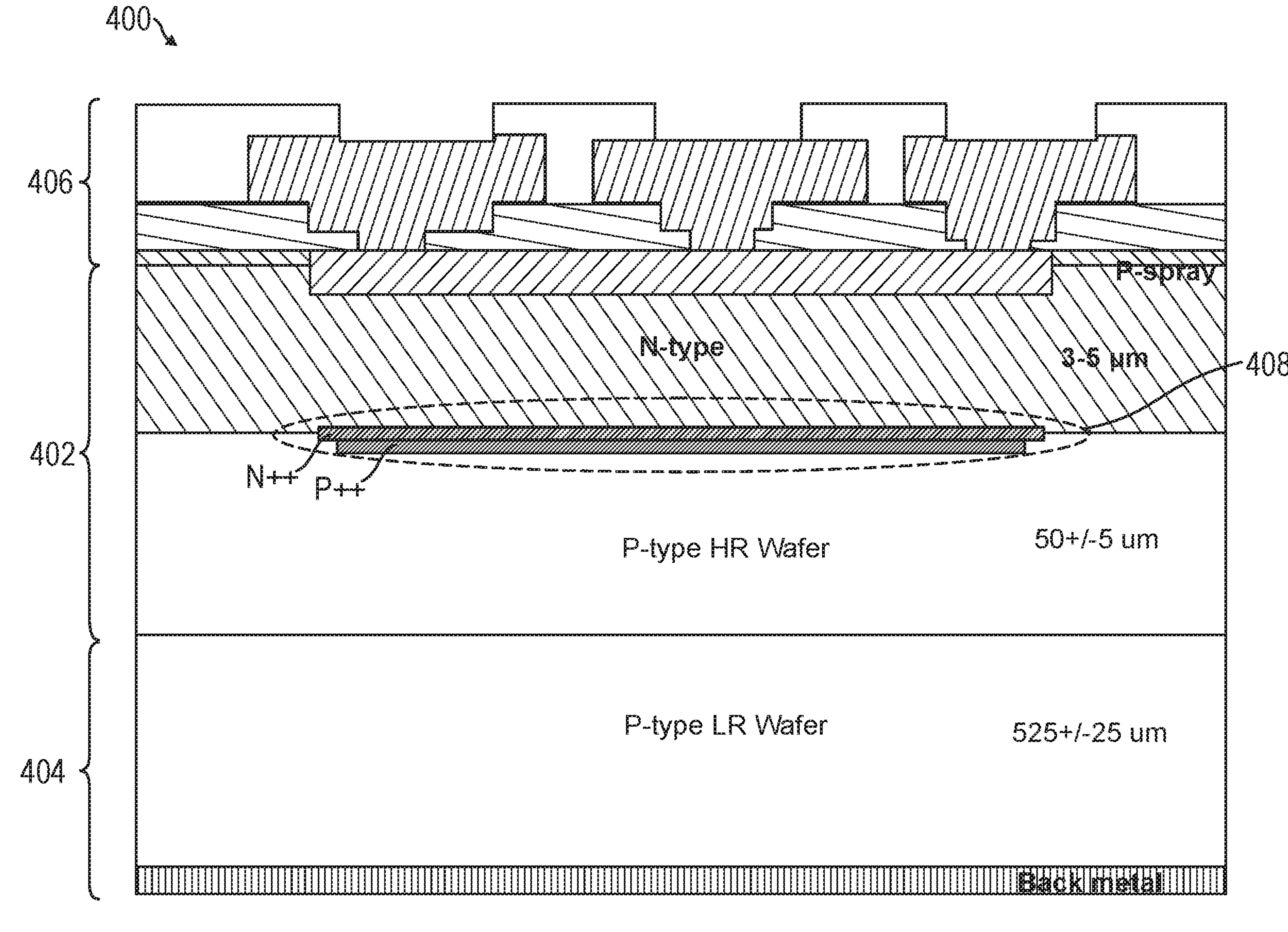
FIG. 4A is a cross-section illustration of a DJ-LGAD formed from a semiconductor substrate with a deep junction in accordance with disclosed embodiments.

FIG. 3B is a technology computer-aided design simulation of electrical field mapping of a deep-junction low-gain avalanche detector formed from a semiconductor substrate with a deep junction in accordance with disclosed embodiments. More specifically, FIG. 4A shows a two-dimensional electric field profile of the DJ-LGAD of FIG. 3A, as a function of depth into a baseline detector and of a lateral coordinate parallel to the surface of the device, for a bias voltage of 210V. For bias voltages above 100 Volts, the electric field in the p-type drift region and the n-type isolation region is relatively insensitive to the applied voltage, leading to stable charge collection properties.

FIG. 4A is a cross-section illustration of a DJ-LGAD 400 formed from a semiconductor substrate with a deep junction in accordance with disclosed embodiments. The DJ-LGAD 400 includes a deep-junction semiconductor substrate 402 on a p-type low resistivity wafer 404, and a top layer construction 406 on the deep-junction semiconductor substrate. The deep-junction semiconductor substrate 402 includes a p-n junction 408 buried a few microns below the upper surface of the semiconductor substrate.

Figure 4B:
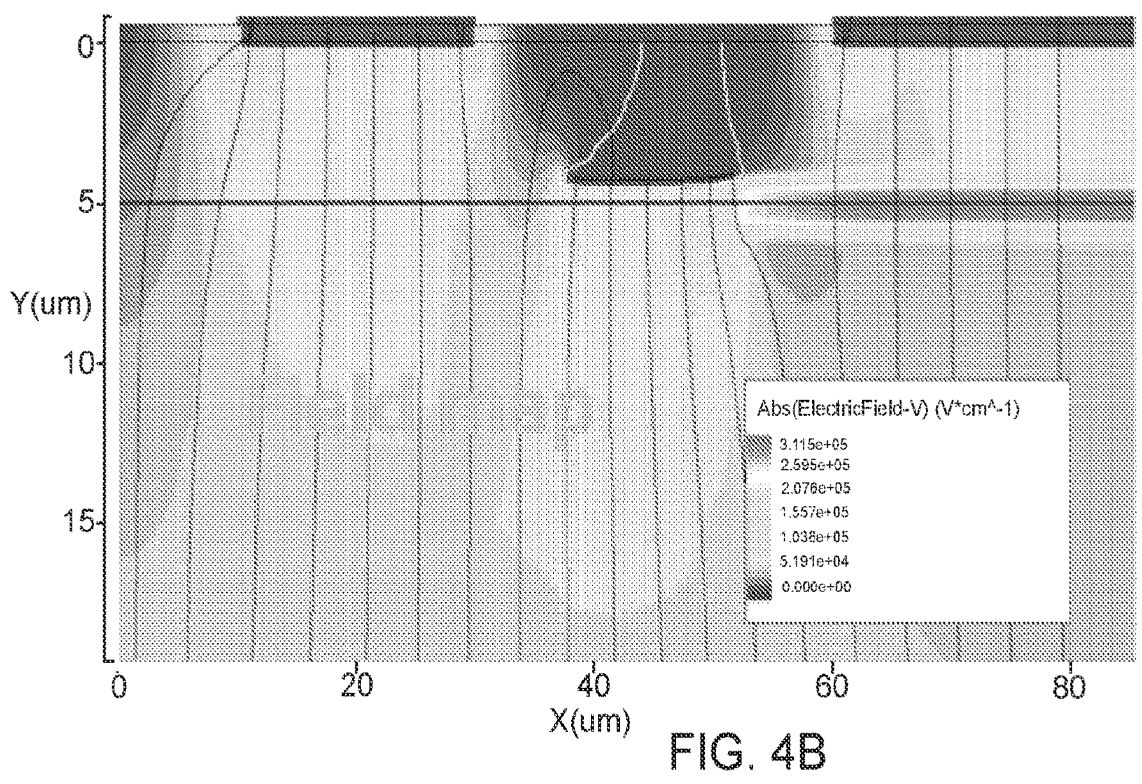
FIG. 4B is field map of the DJ-LGAD of FIG. 4A.

FIG. 4B is field map of deep-junction low-gain avalanche detector formed from a semiconductor substrate with a deep junction in accordance with disclosed embodiments.

Figure 4C:
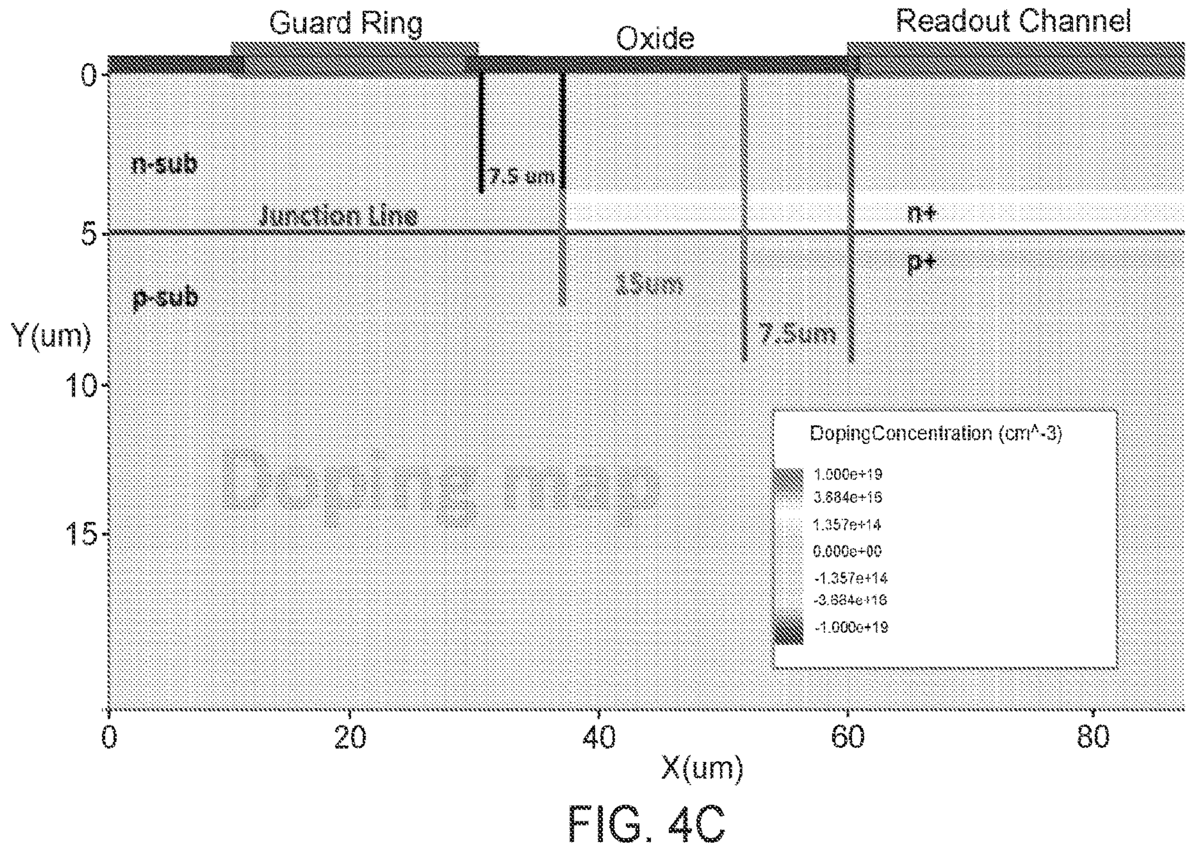
FIG. 4C is a doping map of the DJ-LGAD of FIG. 4A.

FIG. 4C is a doping map of deep-junction low-gain avalanche detector formed from a semiconductor substrate with a deep junction in accordance with disclosed embodiments. With reference to FIG. 4C, junction termination can be formed many ways and variation of the distance between guard ring, n+ and p+ layer. As an example, FIG. 4C shows a 7.5-microns gap from the guard ring to the n+ layer, a 15 microns gap between n+ and p+ layer, and 7.5 microns gap from the p-layer end to readout contacts. Simulation suggests junction termination at the periphery of structure help avoid breakdown. The guard ring mediates field a periphery. Insensitive regions of about 50 microns are only at the edge of the sensor (not between channels). FIG. 4C shows a doping map where junction termination scheme is described. The distances mentioned above can be varied and can be optimized. Other distance parameters can be used. Gain can be stabilized over a range of doping level.

Manufacturing Semiconductor Substrates with Deep Junctions

Deep-junction semiconductor substrates can be manufactures using several different techniques. Example techniques include wafer to wafer bonding, epitaxial layering, and high energy implantation.

Wafer-to-Wafer Bonding Technique

Figure 5:
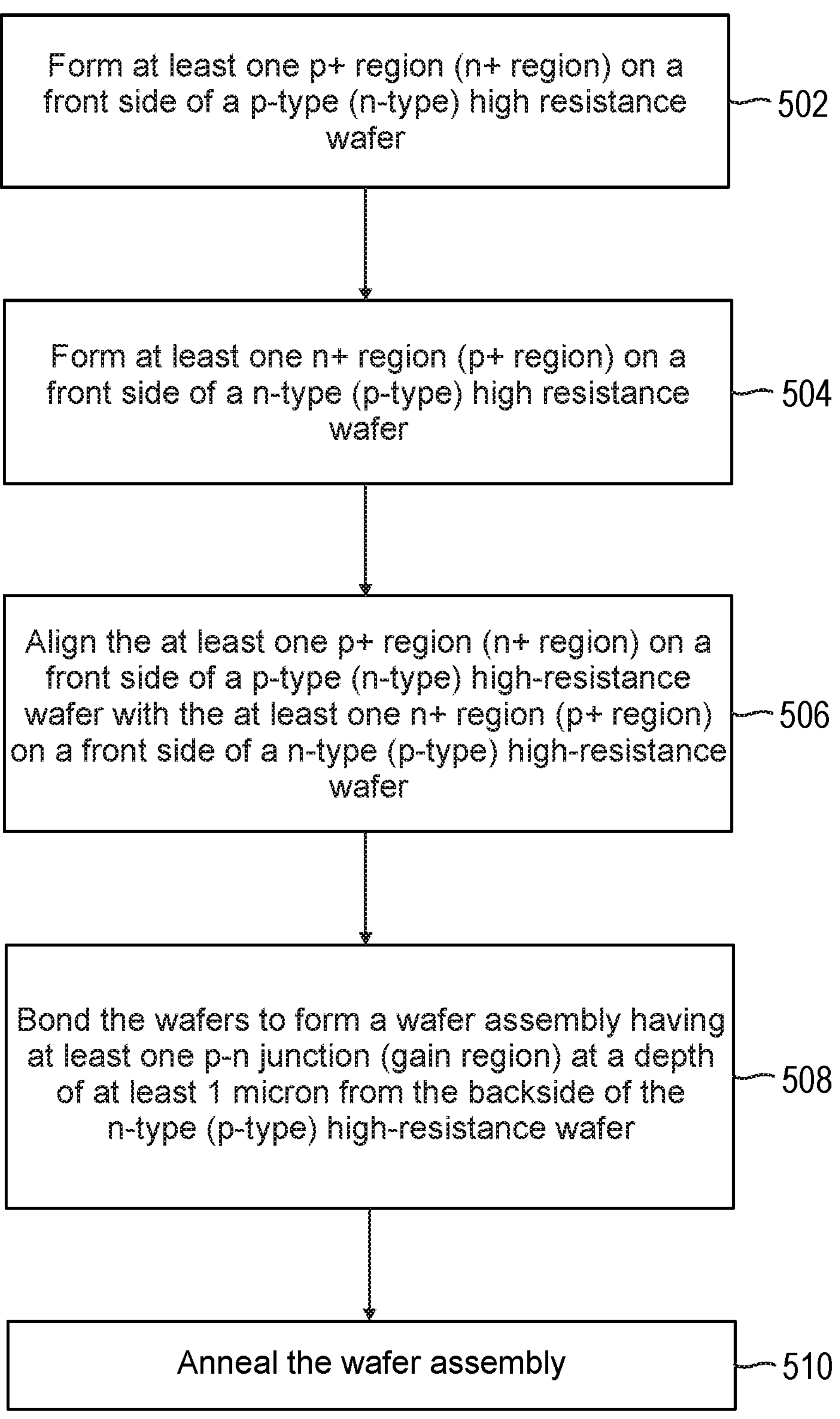
FIG. 5 is a flowchart of a method of manufacturing a semiconductor substrate with a deep junction in accordance with disclosed embodiments by wafer bonding.

FIG. 5 is a flowchart of a method of manufacturing a deep-junction semiconductor substrate that may be used to form a deep-junction low-gain avalanche diode (DJ-LGAD) like the one shown in FIG. 4A. The method involves bonding separately formed wafers to form a wafer assembly having at least one deep p-n junction.

Figure 7A:
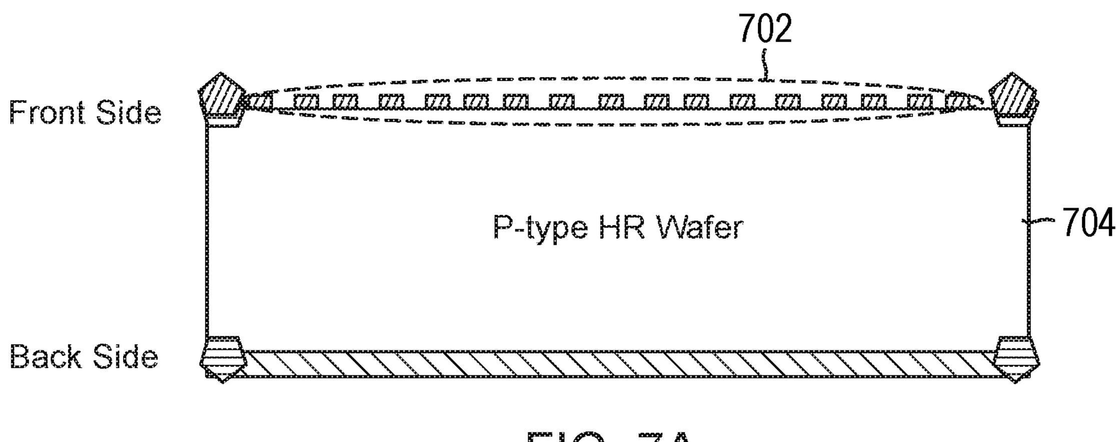

At block 502, at least one p+ region is formed on a front side of a p-type high-resistance wafer. To this end, and with additional reference to FIG. 7A, a patterned photoresist mask 702 is applied to the front side of the p-type high-resistance wafer 704. In some embodiments, a plurality of p+ regions are formed on the front side. Accordingly, the patterned photoresist mask 702 may be configured with an array of unmasked regions, or openings arranged in a first pattern.

Figure 7B:
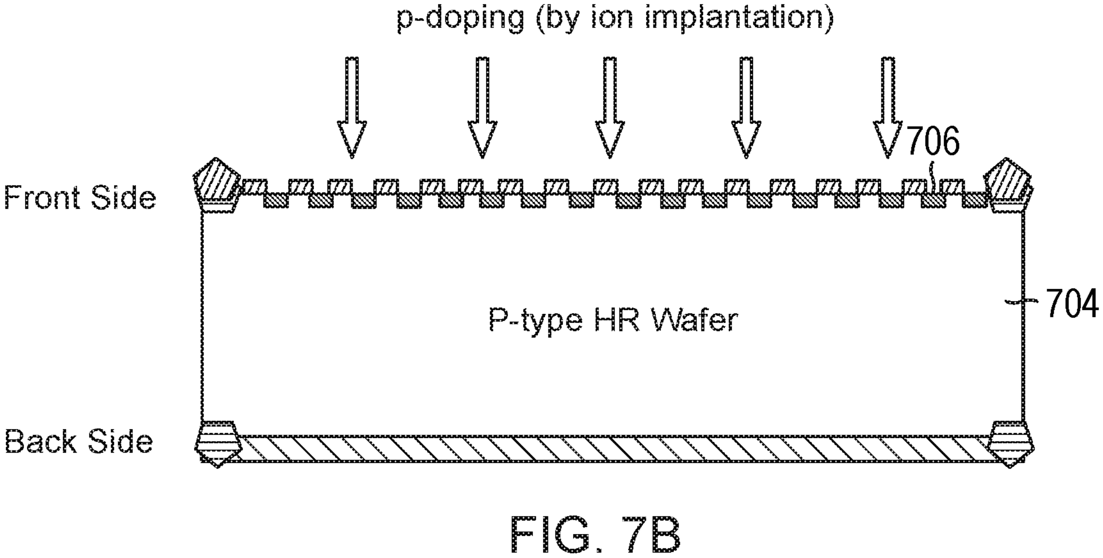

Next, as shown in FIG. 7B, a region 706 (or array of regions) of the front side of the p-type high-resistance wafer 704 left exposed by photoresist mask 702 is (are) p-doped to form one or more p+ regions 706. In some embodiments, the p-doping is performed by ion implantation. Ion implantation may use various energies. Various energies can work for device making. In one example, a p-type wafer received a dose of 1.60e+12 and energy of 375 KeV. In another example, a p-type wafer received a dose of 1.52e+12 and energy of 375 KeV. In these examples, the implantation species was Boron (11)+. In another example, a n-type wafer received a dose of 1.60E+12 and energy of 450 KeV. In yet another example, a n-type wafer received a dose of 1.52E+12 and energy of 450. In these examples, the implantation species was P(31)+. TCAD simulation confirmed implantation conditions produce best results even through various other dose and energy can work.

Figure 7C:
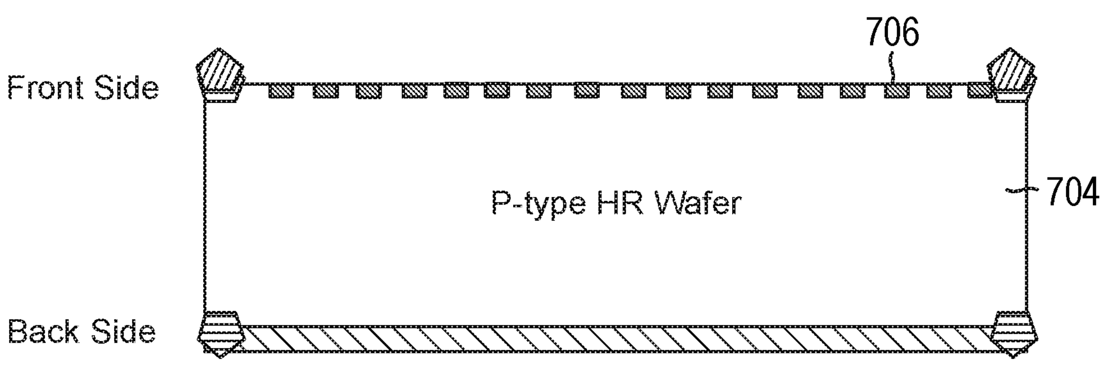

Next, with reference to FIG. 7C, the patterned photoresist mask 702 (shown in FIG. 7B) is stripped from the front side of the p-type high-resistance wafer 704, and the front side is cleaned. For example, the front side may be cleaned using RCA-1 cleaning.

Figure 6A:
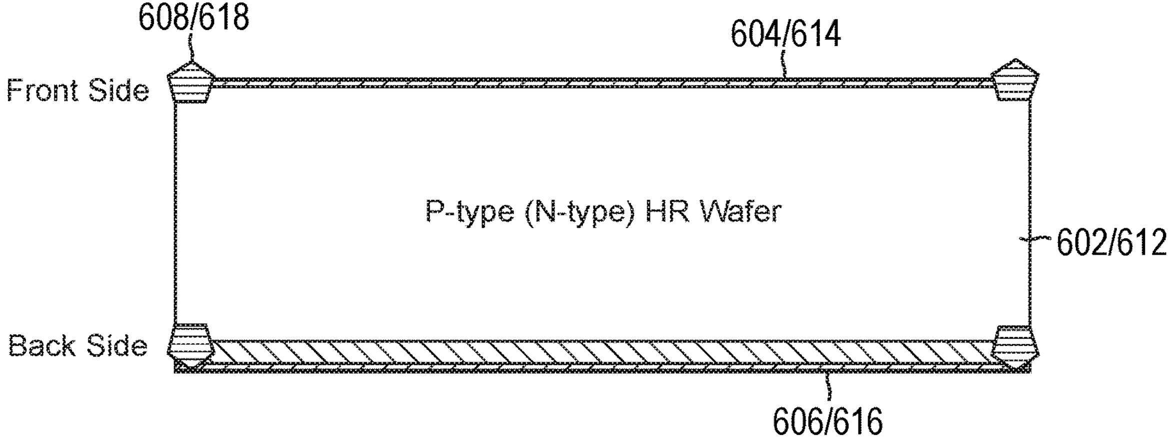
FIGS. 6A-9B are illustrations of some of the manufacturing stages of the method of FIG. 5.
Figure 6B:
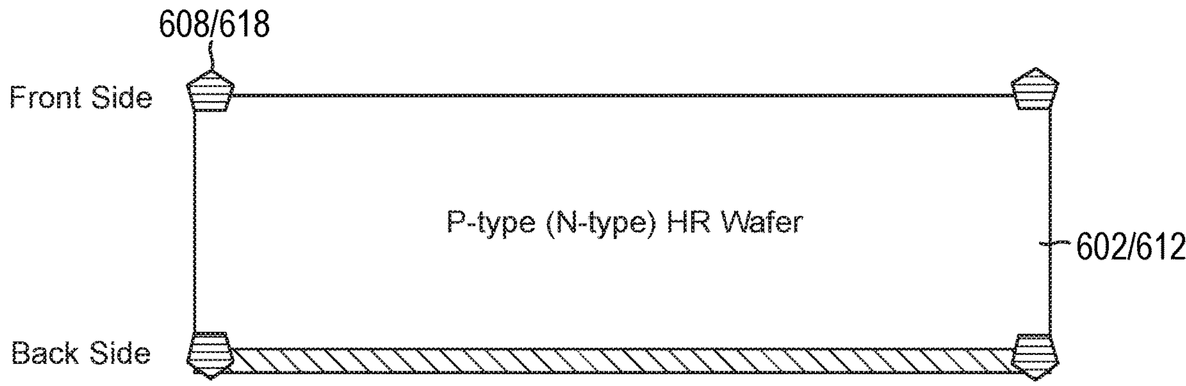

With reference to FIGS. 6A and 6B, p-type high-resistance wafer 602 may include a front resist layer 604 on the front side and a backside resist layer 606 on the back side. Accordingly, ahead of forming the p+ regions 706 (shown in FIG. 7B) on the front side of a p-type high-resistance wafer 602, the front resist layer 604 may be stripped from the front side prior to applying the patterned photoresist mask 702. The backside resist layer 606 is also stripped from the back side.

Furthermore, with reference to FIGS. 6A, 6B, and 7C, to assist with subsequent alignment of the p+ regions 706 on the front side of a p-type high-resistance wafer 704 with n+ regions on the front side of a n-type high-resistance wafer, alignment keys 608 may be associated with the front side alignment of the p-type high-resistance wafer 602.

Figure 8A:
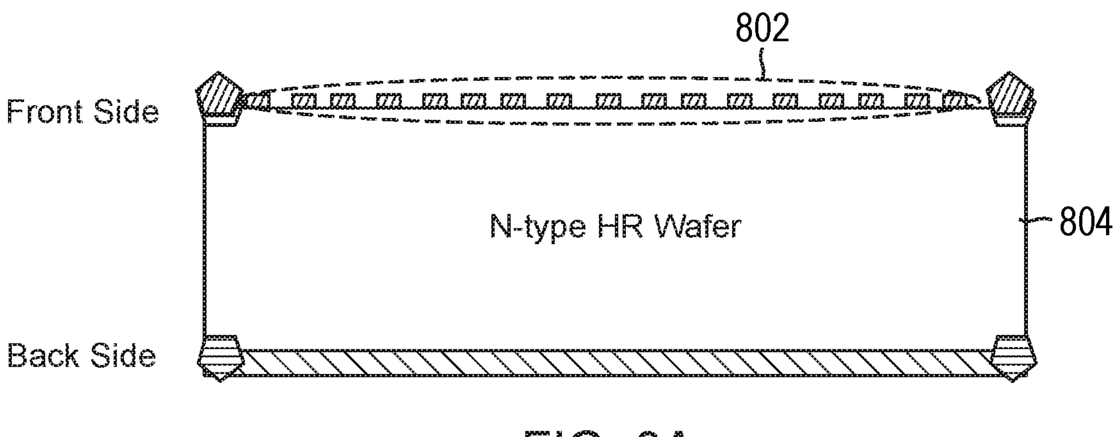

At block 504, at least one n+ region is formed on a front side of a n-type high-resistance wafer. To this end, and with additional reference to FIG. 8A, a patterned photoresist mask 802 is applied to the front side of the n-type high-resistance wafer 804. In some embodiments, a plurality of n+ regions are formed on the front side. Accordingly, the patterned photoresist mask 802 may be configured with an array of unmasked regions, or openings arranged in a pattern the same as or similar to the first pattern used to form the p+ regions are formed on the front side of the p-type high-resistance wafer. In some embodiments, the n+ regions formed on the front side of the n-type high-resistance wafer may be a different size than the p+ regions formed on the front side of the p-type high-resistance wafer. For example, n+ regions may have a dimension greater than a corresponding dimension of the at least one p+ region. An example of this structure is shown in FIG. 4A, where the n+ region (the N++ implant) of the p-n junction 408 extends past the p+ region (the P++ implant).

Figure 8B:
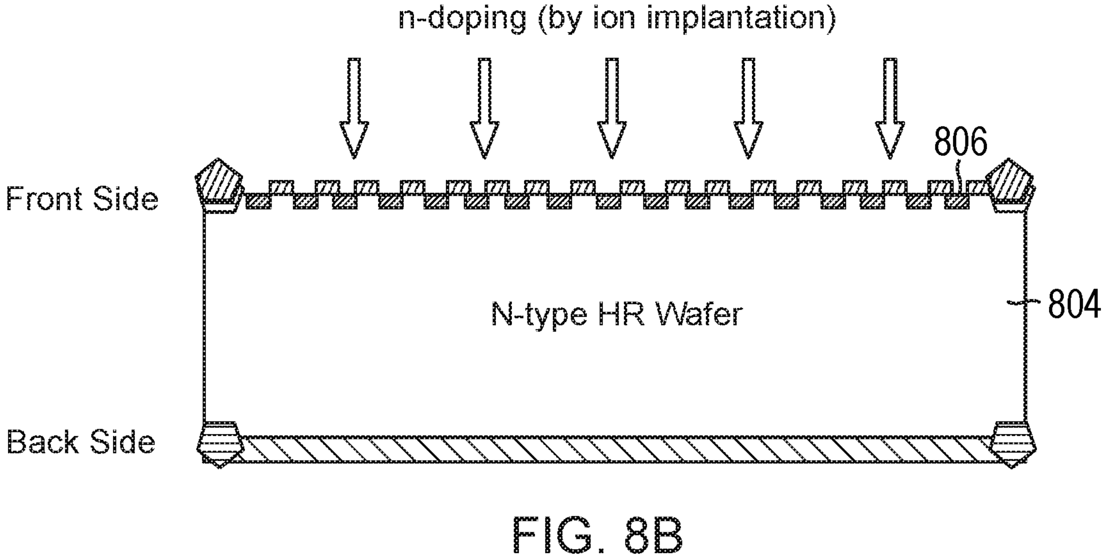

Next, as shown in FIG. 8B, a region 806 (or array of regions) of the front side of the n-type high-resistance wafer 804 left exposed by photoresist mask 802 is (are) is (are) n-doped to form one or more n+ regions 806. In some embodiments, the n-doping is performed by ion implantation. Ion implantation may use various energies. Next, with reference to FIG. 8C, the patterned photoresist mask 802 (shown in FIG. 8B) is stripped from the front side of the n-type high-resistance wafer 804. The front side may be cleaned. For example, the front side may be cleaned using RCA-1 cleaning.

With reference to FIGS. 6A and 6B, the n-type high-resistance wafer 612 may include a front resist layer 614 on the front side and a backside resist layer 616 on the back side. Accordingly, ahead of forming the n+ regions 806 (shown in FIG. 8B) on the front side of a n-type high-resistance wafer 612, the front resist layer 614 may be stripped from the front side prior to applying the patterned photoresist mask 802. The backside resist layer 616 is also stripped from the back side.

Figure 8C:
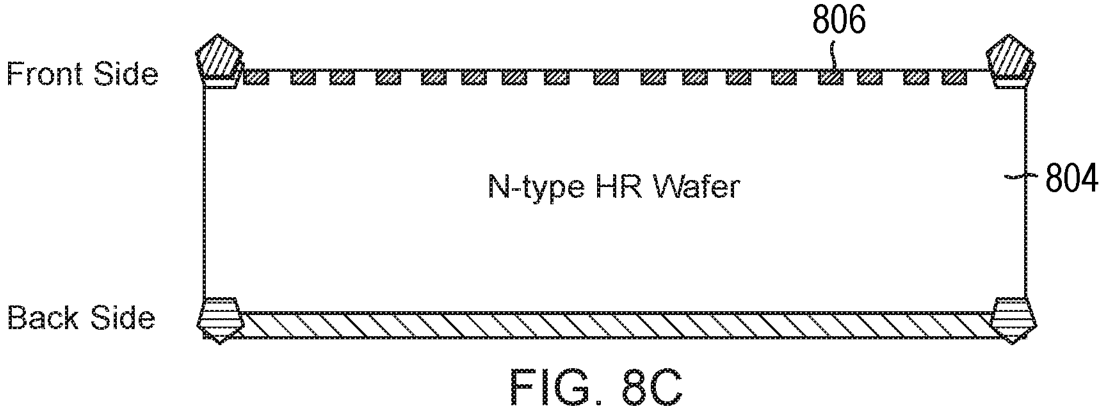

Furthermore, with reference to FIGS. 6A, 6B, and 8C, to assist with subsequent alignment of the n+ regions 806 on the front side of a n-type high-resistance wafer 804 with p+ regions on the front side of a p-type high-resistance wafer, alignment keys 618 may be associated with the front side alignment of the n-type high-resistance wafer 612.

Figure 9A:
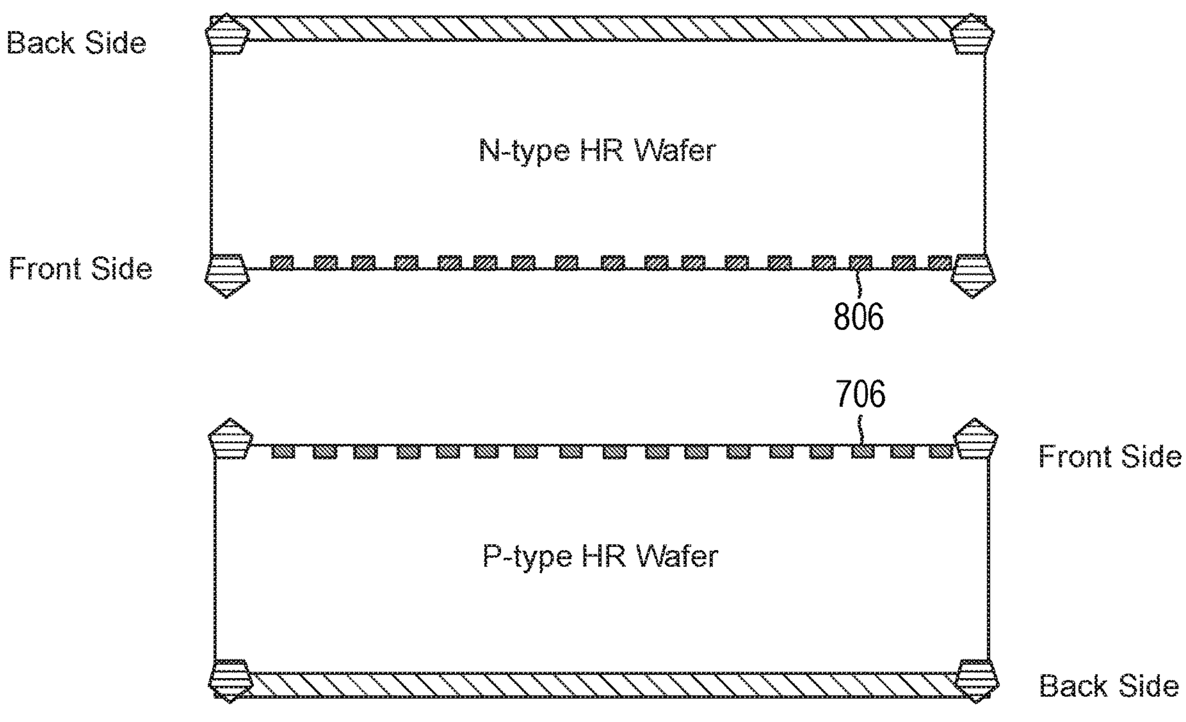

At block 506, and with additional reference to FIG. 9A, the at least one p+ region on a front side of a p-type high-resistance wafer is aligned with the at least one n+ region on a front side of a n-type high-resistance wafer.

Figure 9B:
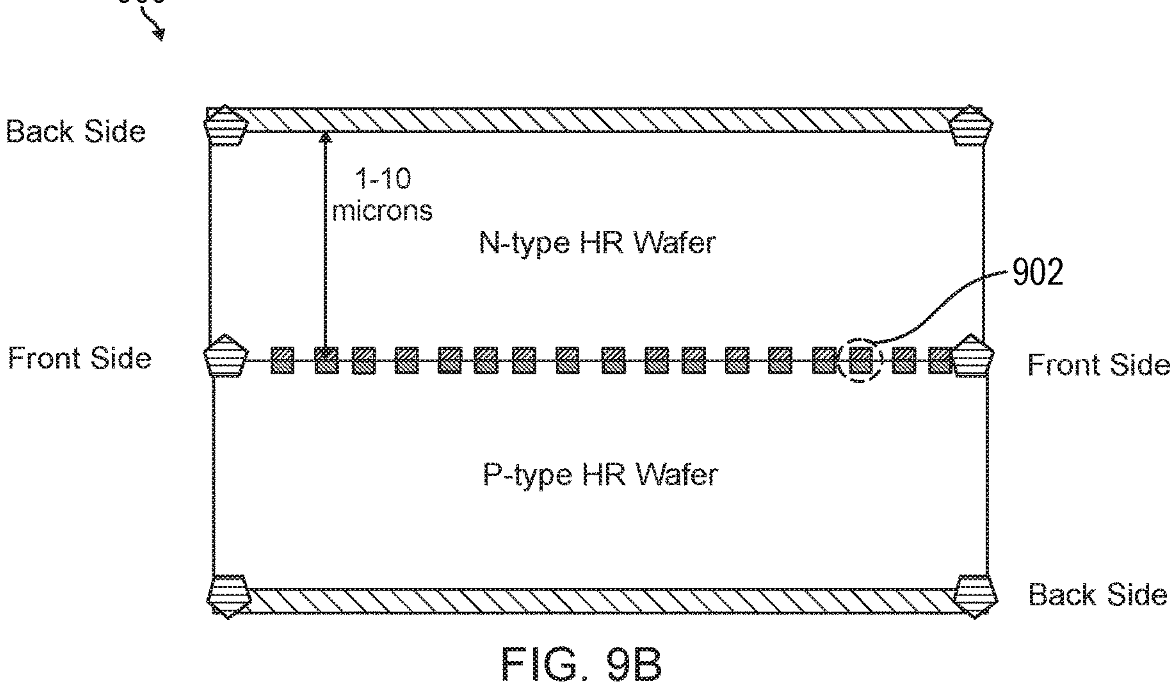

At block 508, and with additional reference to FIG. 9B, the front sides of the wafers are bonded together to form a wafer assembly 900 having a plurality of deep p-n junctions 902 at a depth of at least 1 micron from the backside of the n-type high-resistance wafer. The deep p-n junctions 902 corresponds to the interface between a n+ region 806 and a p+ region 706. The depth of the p-n junctions 902 from the backside of the n-type high-resistance wafer may be between 1-10 microns. In some embodiments, the depth of the p-n junctions 902 from the backside of the n-type high-resistance wafer may be between 3-5 microns. Various bonding temperatures and process parameters can be used when bonding the wafers to form the deep junction. The bonding may be done using pressure.

At block 510, the wafer assembly is annealed using standard techniques. Maximum annealing temperature can be as high as 1050 degrees C., however, annealing at a temperature above 900 degrees C. may affect performance of the DJ-LGAD.

Figure 12:
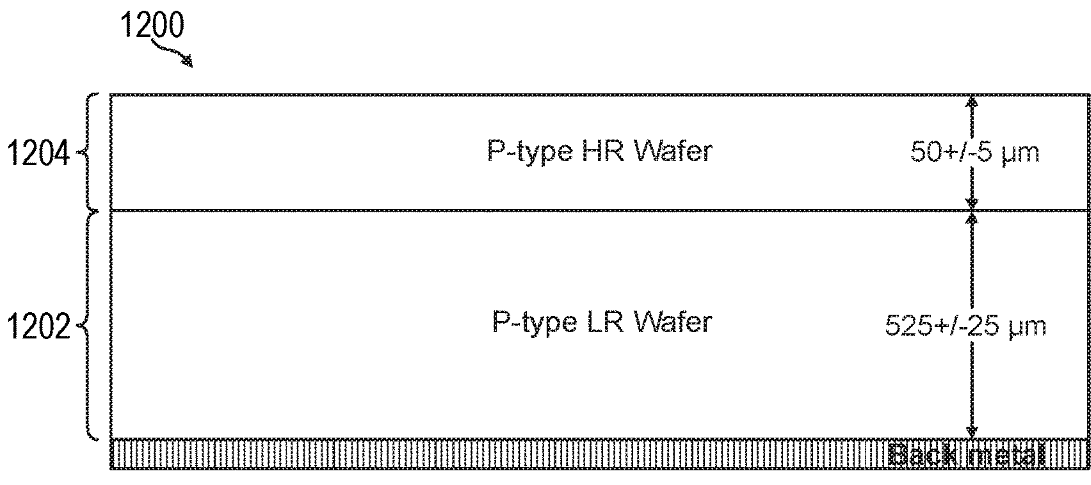
FIG. 12 is an illustration of an engineered substrate used to from the semiconductor substrates with deep junctions in accordance with disclosed embodiments.

While the foregoing wafer-to-wafer bonding technique of manufacturing a deep-junction semiconductor substrate describes p-doping a p-type high resistivity substrate, in other embodiments an p-type engineered substrate may be used. In some embodiments, the p-type engineered substrate may be formed of a p-type low resistivity wafer bonded to a p-type high resistivity wafer. In this embodiment, the p-type high resistivity wafer of the p-type engineered substrate would be p-doped as described in block 502 of the flowchart. For example, with reference to FIG. 12, an engineered substrate 1200 may include a low resistivity wafer 1202 having a thickness of 200-850 microns silicon bonded with p-type high resistivity substrate 1204 having a thickness of 30-50 microns. A n-type high resistivity third layer (not shown in FIG. 12) having a thickness of 2-5 microns and a high resistivity (typically above 1000 ohm-cm) may be added on top of the p-type high resistivity substrate 1204. This top layer may be a bonded layer or a well-defined epitaxy layer. Chemical vapor deposition may be used to grow the epitaxy layer. This configuration of engineered substrates enables radiation hardened avalanche-based detectors. Well-defined epitaxy layer or bonded thin layer with tuned dopant profiles reduces the loss of gain during irradiation due to acceptor removal in the gain layer.

In another embodiment, the p-type engineered substrate may comprise a p-type epitaxial layer built on top of a p-type low resistivity wafer using planar or graded epitaxy. In this embodiment, the p-type epitaxial layer of the p-type engineered substrate would be p-doped as described in block 502 of the flowchart.

Epitaxial Technique

Figure 10:
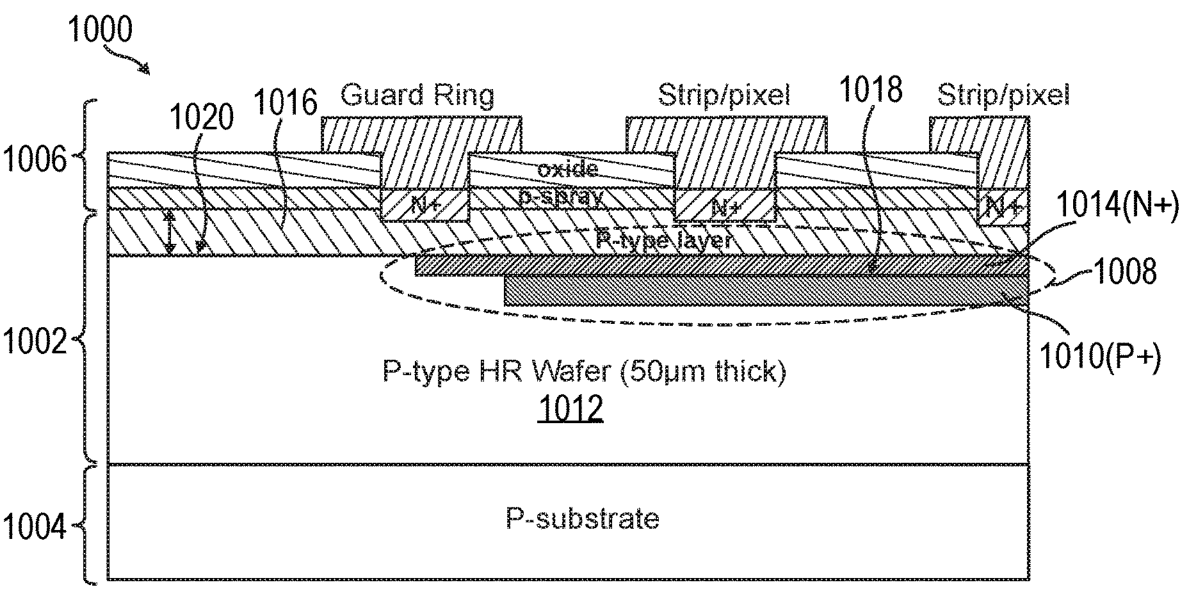
FIG. 10 is an illustration of a DJ-LGAD formed from a second embodiment of a semiconductor substrate with a deep junction in accordance with disclosed embodiments.

FIG. 10 is an illustration of a DJ-LGAD 1000 formed from a second embodiment of a semiconductor substrate with a deep junction in accordance with disclosed embodiments. The DJ-LGAD 1000 includes a deep-junction semiconductor substrate 1002 on a p-type low resistivity wafer 1004, and a top layer construction 1006 on the deep-junction semiconductor substrate. The deep-junction semiconductor substrate 1002 includes a gain layer 1008 comprising a p+ region 1010, a n+ region 1014, and a p-n junction 1018 between the two regions. The p-n junction 1018 located a few microns below the upper surface or front side 1020 of the semiconductor substrate 1002.

Figure 11:
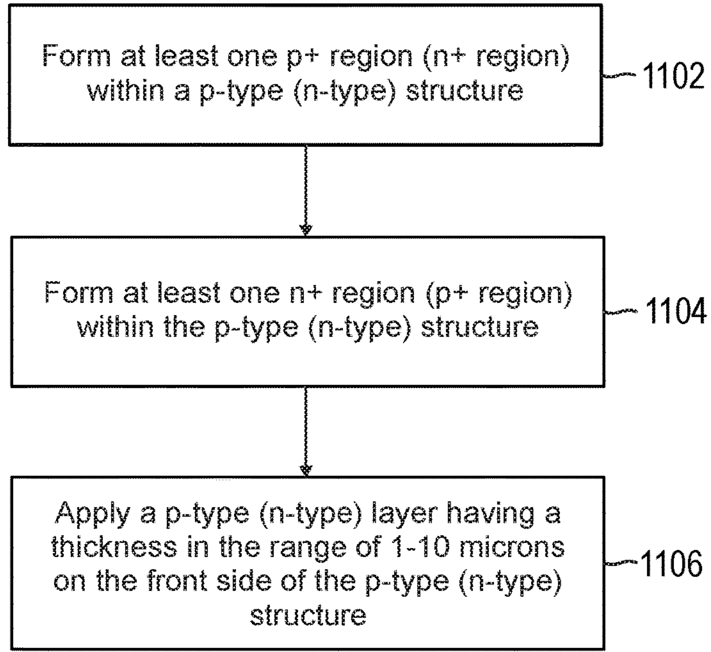
FIG. 11 is a flowchart of a method of manufacturing a semiconductor substrate with a deep junction in accordance with disclosed embodiments by epitaxy.

FIG. 11 is a flowchart of a method of manufacturing a semiconductor substrate that may be used to form a deep-junction low-gain avalanche diode (DJ-LGAD) like the one shown in FIG. 10. The method may involve epitaxial layering.

At block 1102, and with reference to FIG. 10, at least one p+ region 1010 is formed within a p-type high resistivity structure 1012 at a depth from the front side 1020 of the p-type high resistivity structure in the range 0 to 2 microns. The p-type high resistivity structure 1012 may be a p-type high resistivity wafer and may have a thickness in the range of 20-70 microns. The p+ region 1010 may be formed by p-doping the p-type structure 1012. For example, the p+ region 1010 may be formed by implanting p+ dopant using high ion implantation techniques.

At block 1104, at least one n+ region 1014 is formed within the p-type high resistivity structure 1012 above the least one p+ region 1010. The n+ region 1014 may be formed by n-doping the p-type structure 1012. For example, the n+ region 1014 may be formed by implanting p+ dopant using high ion implantation techniques.

At block 1106, a p-type high resistivity layer 1016 having a thickness in the range of 1-8 microns and a high resistivity (typically above 1000 ohm-cm) is applied on the front side 1020 of the p-type high resistivity structure 1012. The p-type high resistivity layer 1016 may be applied using an epitaxy process. For example, chemical vapor deposition may be used to grow a p-type epitaxy layer. In some embodiments, the p-type epitaxy layer 1016 may comprise a single concentration of p+ dopant or a graded concentration of p+ dopant. As an alternative to epitaxy growth, the p-type high resistivity layer 1016 may be separately manufactured and bonded to the front side 1020 of the p-type high resistivity structure 1012.

The resulting semiconductor substrate 1002 has at least one deep p-n junction 1018 at a depth of at least 1 micron from the front side of the p-type (n-type) structure. This configuration of engineered substrates enables radiation hardened avalanche-based detectors. Well-defined epitaxy layer or bonded thin layer with tuned dopant profiles reduces the loss of gain during irradiation due to acceptor removal in the gain layer.

Figure 14:
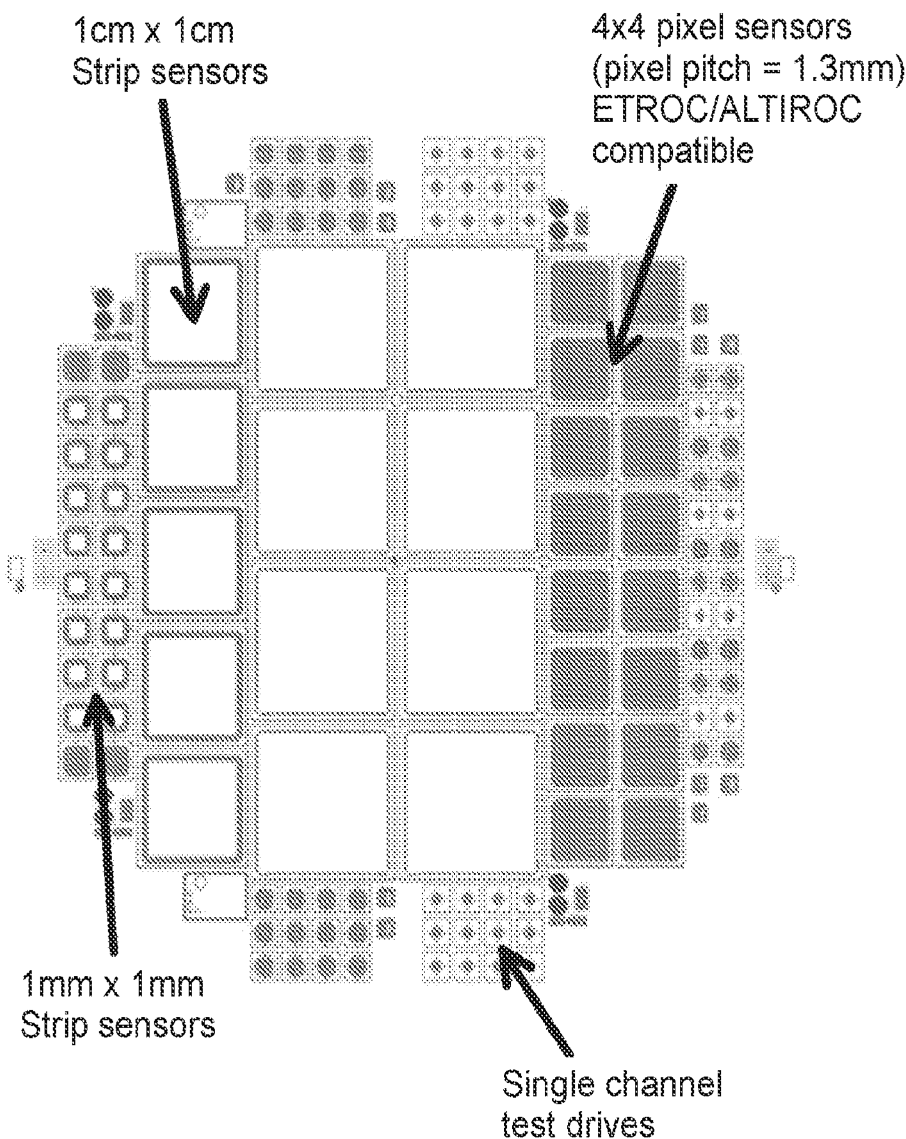
FIG. 14 is an illustration of a mask layout for a wafer manufactured in accordance with techniques disclosed herein to include deep junctions for sensor applications.

FIG. 14 is an illustration of a mask layout for a semiconductor substrate manufactured in accordance with techniques disclosed herein to include deep junctions for sensor applications. In one use the semiconductor substrate, the DJ-LGAD 1000 of FIG. 10 may be manufactured using a wafer assembly. For example, one or more electrodes (guard ring and/or strip/pixel) electrodes are formed by implanting N+ regions into the p-type layer 1016 at locations relative to the gain layer 1008, and then depositing metal contacts over the N+ regions.

Deep Implantation Technique

Figure 13:
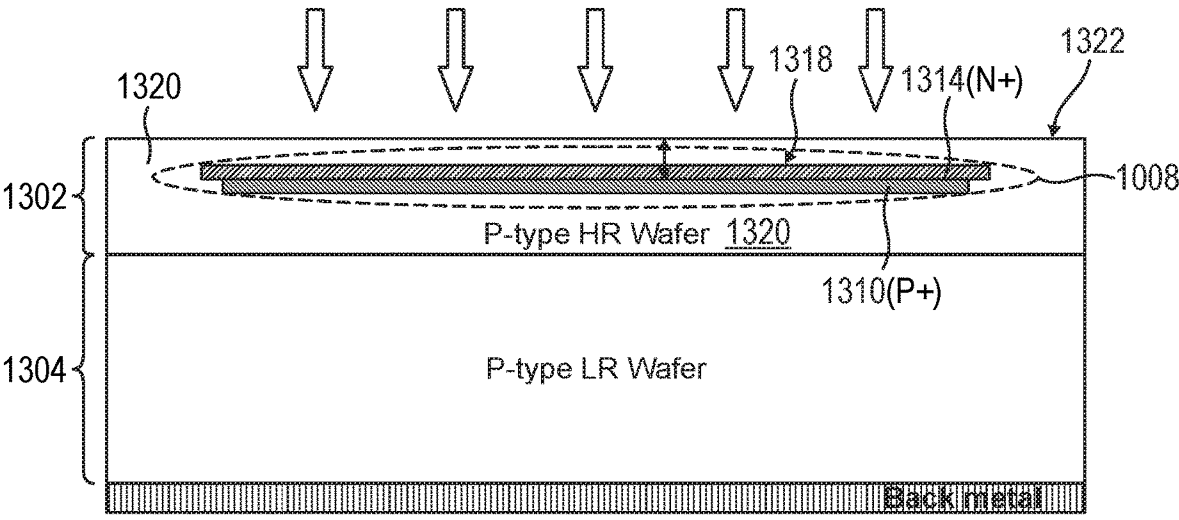
FIG. 13 is an illustration of a third embodiment of a semiconductor substrate with a deep junction in accordance with disclosed embodiments.

FIG. 13 is an illustration of a third embodiment of a semiconductor substrate 1302 with a deep junction in accordance with disclosed embodiments. The deep-junction semiconductor substrate 1302 is shown bonded to a p-type low resistivity wafer 1304. The deep-junction semiconductor substrate 1302 includes p-type high resistivity wafer 1320 with a gain layer 1308 comprising a p+ region 1310, a n+ region 1314, and a p-n junction 1318 between the two regions that is located a few microns below the upper surface of the p-type high resistivity wafer.

Deep implantation is used to build the semiconductor substrate 1302. To this end, a high energy implanter, such as a MeV implanter, is used. First, a region of the p-type high resistivity wafer 1320 is implanted with n++ dopant to a depth just beneath the upper surface of the p-type high resistivity wafer and up to 5 microns. Next, a region of the p-type high resistivity wafer 1320 is implanted with p++ dopant to form a p-n junction 1318 with the region of n++ dopant. Next, the semiconductor substrate 1302 may be polish the wafer to eliminate damaged caused by high energy implanter. This process can be used as vice versa for dopant implantations.

In one example configuration, the p-type low resistivity wafer 1304 has a thickness between 500-550 microns, and the p-type high resistivity wafer 1320 has a thickness between 45-55 microns.

Application of Semiconductor Substrate

As described above, the deep-junction semiconductor substrate disclosed herein may be used to manufacture an avalanche diode, such as the DJ-LGAD 1000 of FIG. 10. Additional process steps associated with the manufacture of a DJ-LGAD may include: 1) thinning of top n-type (p-type) layer, 2) depositing oxide layer on the top n-type (p-type) layer by plasma etched chemical vapor deposition (PECVD), 3) Pspray implant between top n-type (p-type) layer and oxide deposition, 4) etching oxide deposition in areas above the deep junction, 5) implanting N+ dopant in etched regions of oxide layer, and 6) forming surface contacts that couple to the N+ implant.

The deep-junction semiconductor substrate disclosed may be used to manufacture an avalanche diode, comprising: a semiconductor structure including: an n-type (p-type) region including a plurality of segments each including an implanted region having a higher dopant density than the n-type (p-type) region; a p-type (n-type) region; and a gain region between the n-type (p-type) region and the p-type (n-type) region, the gain region buried between the n-type (p-type) region and the p-type (n-type) region and the gain region including: an n+-type region having a higher n-type dopant density than the n-type region; a p+-type region having a higher p-type dopant density than the p-type region; and a p-n junction between the n+-type region and the p+-type region; a readout structure comprising a plurality of first electrodes, wherein at least one of the first electrodes is on each of the segments and the first electrodes on different segments are electrically isolated from one another; each of segments including a first ohmic contact between the implanted region and the at least one of the first electrodes on the implanted region; a second ohmic contact between the p-type (n-type) region and a second electrode; and wherein the p-n junction experiences a reverse bias electric field when an appropriate polarity bias is applied between the first electrodes and the second electrode.

The deep-junction semiconductor substrate disclosed herein may find application in a variety of sensor/detector designs and structures. For example, the deep-junction semiconductor substrate may be used in silicon sensors, silicon detectors, and semiconductor sensors including, for example, semiconductor diode sensors, avalanche photo detector or diode, and compound semiconductor sensors or detectors. Compound semiconductors commonly refers to III-V materials in the periodic table such as gallium arsenide (GaAs), Indium Phosphide (InP) and others.

The deep-junction semiconductor substrate may be used in semiconductor sensors, such as low-gain avalanche photo detector or diode (LGAD), deep-junction low-gain avalanche photo detectors or diodes (DJ-LGAD), avalanche photo detectors or diodes at Geiger Mode, photon multipliers, single photon multipliers, photo detectors in various wavelength (from UV, visible to near IR to telecom wavelength such as from 200 nm to 2.5 microns), and charge particle detectors or diodes. Charge particle generally refers to photon, electrons, neutron, muon, neutrinos and similar. The present disclosure also relates to semiconductor sensors, such as x-ray detectors.

The deep-junction semiconductor substrate may be used in semiconductor sensors, such as Compton camera detectors, impact ionization detectors, low energy x-ray detectors, x-ray absorber detectors. X-ray absorber refers to the materials that absorb photon or x-rays such as silicon germanium, GaAs, InP, mercury cadmium telluride. Further regarding x-ray applications, silicon APD (Si APD) can be used. In the low energy x-ray region called the soft x-ray region generally from a 5 eV to 100 KeV, direct detection by Si APD can be utilized. For hard x-rays regions, Si APD can be utilized in coupling with Scintillator.

The deep-junction semiconductor substrate may be used in semiconductor sensors, such as 4D detectors (e.g., a 4D detector for faster time and space resolution), 5D detectors (e.g., a 5D detector for timing, space, and energy resolution), and quantum sensors. When sensors are used as charge particle detectors, the performance metrics can also include position resolution for passing particles, time resolution on particles impacting the sensor, and overall rate capabilities. In this case, it is termed as 4D detector. When it also includes energy, it is termed as 5D detector.

APDs based on silicon are also applicable in short wavelength (UV, visual) and Near Infrared type. APDs based on III-V materials (GaAs, InGaAs, InP and others) are infrared detectors having an internal multiplication like Si APD but works in 1 to 2.5 microns wavelength regime. The innovation in this art can be equally applicable in III-V materials-based detectors, such as GaAs, InP, GaInAs. Radiation tolerance is becoming a requirement in a broad array of devices. In this art, a new classes of sensors construction described can be used as radiation hardened sensors.

The various aspects of this disclosure are provided to enable one of ordinary skill in the art to practice the present invention. Various modifications to exemplary embodiments presented throughout this disclosure will be readily apparent to those skilled in the art, and the concepts disclosed herein may be extended to other magnetic storage devices. Thus, the claims are not intended to be limited to the various aspects of this disclosure, but are to be accorded the full scope consistent with the language of the claims. All structural and functional equivalents to the various components of the exemplary embodiments described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

What is claimed is:

1. A method of manufacturing a semiconductor substrate having a deep junction, the method comprising:

forming at least one p+ region on a front side of a p-type high-resistance wafer;

forming at least one n+ region on a front side of a n-type high-resistance wafer;

aligning the at least one p+ region on a front side of a p-type high-resistance wafer with the at least one n+ region on a front side of a n-type high-resistance wafer; and bonding the front sides of the high-resistance wafers to form a wafer assembly having at least one deep p-n junction at a depth of at least 1 micron from a backside of the n-type or p-type high-resistance wafer.

2. The method of claim 1, wherein the at least one deep p-n junction is between the at least one n+ region and the at least one p+ region.

3. The method of claim 1, wherein a distance between the n+ region or p+ region and the backside of the n-type or p-type high-resistance wafer is between 1-10 microns.

4. The method of claim 1, wherein a distance between the n+ region or p+ region and the backside of the n-type or p-type high-resistance wafer is between 3-5 microns.

5. The method of claim 1, wherein the at least one n+ region comprises a plurality of n+ regions arranged in a first pattern, the at least one p+ region comprises a plurality of n+ regions arranged in the first pattern.

6. The method of claim 1, wherein the at least one n+ region has a dimension greater than a corresponding dimension of the at least one p+ region.

7. The method of claim 1, wherein forming at least one p+ region or n+ region on a front side of a p-type or n-type high-resistance wafer comprises:

applying a patterned photoresist mask to the front side, p-doping or n-doping a region of the front side to form the at least one p+ region or n+ region, and stripping the patterned photoresist mask from the front side.

8. The method of claim 7, further comprising stripping a front resist layer from the front side and a backside resist layer from a backside of the p-type or n-type high-resistance wafer prior to applying the patterned photoresist mask.

9. The method of claim 7, wherein p-doping or n-doping is performed by ion implantation.

10. The method of claim 1, wherein forming at least one n+ region or p+ region on a front side of a n-type or p-type high-resistance wafer comprises:

applying a patterned photoresist mask to the front side, n-doping or p-doping a region of the front side to create the at least one n+ region or p+ region, and stripping the patterned photoresist mask from the front side.

11. The method of claim 10, wherein n-doping or p-doping is performed by ion implantation.

12. The method of claim 1, further comprising, annealing the wafer assembly.

13. The method of claim 12, wherein annealing of the wafer assembly is done at a temperature below 900 degrees C.

14. A method of manufacturing a sensor comprising:

obtaining a semiconductor substrate having a deep junction, wherein the semiconductor substrate is manufactured in accordance with the method of claim 1; and forming a top layer construction on the semiconductor substrate, the top layer construction comprising one or more electrodes above the deep junction.

15. The method of claim 14, wherein forming a top layer construction on the semiconductor substrate comprises:

implanting n+ dopant or p+ dopant into at least one region of the semiconductor substrate at a location above the deep junction, and depositing a metal contact at the region.

* * * * *